(12) United States Patent
Aksel et al.

(10) Patent No.: US 8,108,987 B2
(45) Date of Patent: Feb. 7, 2012

(54) METHOD OF MANUFACTURING A POLE FACE FOR A PERMANENT MAGNET MRI SYSTEM WITH LAMINATED STRUCTURE

(75) Inventors: Bulent Aksel, Clifton Park, NY (US); Judson Sloan Marte, Wynantskill, NY (US); Juliana Chiang Shei, Niskayuna, NY (US); Mark Gilbert Benz, Lincoln, VT (US); Yuji Inoue, Tokyo (JP)

(73) Assignee: General Electric Company, Niskayuna, NY (US)

( * ) Notice: Subject to any disclaimer, the term of this patent is extended or adjusted under 35 U.S.C. 154(b) by 843 days.

(21) Appl. No.: 10/979,228

(22) Filed: Nov. 3, 2004

(65) Prior Publication Data
US 2005/0062571 A1    Mar. 24, 2005

Related U.S. Application Data

(62) Division of application No. 10/248,170, filed on Dec. 23, 2002, now Pat. No. 6,825,666.

(51) Int. Cl.
*H01F 7/127* (2006.01)
(52) U.S. Cl. ............ 29/607; 29/609; 148/103; 148/108; 324/307; 324/309; 335/296; 335/297
(58) Field of Classification Search .................. 29/607, 29/604, 609, 602.1, 593, 419.2, 737; 148/101, 148/103, 108; 324/319, 318, 320, 307, 309, 324/322; 335/296, 297
See application file for complete search history.

(56) References Cited

U.S. PATENT DOCUMENTS

| | | | |
|---|---|---|---|
| 2,188,091 A * | 1/1940 | Baermann, Jr. | 29/607 X |
| 4,770,723 A | 9/1988 | Sagawa et al. | |
| 5,621,324 A | 4/1997 | Ota et al. | |
| 5,677,630 A | 10/1997 | Laskaris et al. | |
| 5,680,086 A | 10/1997 | Allis et al. | |
| 5,721,523 A | 2/1998 | Dorri et al. | |
| 5,801,609 A | 9/1998 | Laskaris et al. | |
| 6,100,780 A | 8/2000 | Dorri et al. | |
| 6,150,819 A | 11/2000 | Laskaris et al. | |
| 6,211,676 B1 | 4/2001 | Byrne et al. | |
| 6,259,252 B1 | 7/2001 | Laskaris et al. | |
| 6,340,888 B1 | 1/2002 | Aoki et al. | |
| 6,518,867 B2 | 2/2003 | Laskaris et al. | |
| 6,889,422 B2 * | 5/2005 | Doi | 29/602.1 |

FOREIGN PATENT DOCUMENTS

| | | | | |
|---|---|---|---|---|
| EP | 0 978 727 A2 | 2/2000 | | |
| EP | 0 978 727 A3 | 5/2001 | | |
| JP | 59-103309 | * 6/1984 | | 148/103 |
| JP | 2-246927 | * 10/1990 | | |
| JP | 08-066379 | 3/1996 | | |
| JP | 08-206092 | 8/1996 | | |
| JP | 09-201347 | 8/1997 | | |
| JP | 10-199724 | 7/1998 | | |
| JP | 2000-139874 | 5/2000 | | |

* cited by examiner

*Primary Examiner* — A. Dexter Tugbang
(74) *Attorney, Agent, or Firm* — Marie Claire B. Maple

(57) ABSTRACT

A method of manufacturing a magnetic resonance imaging (MRI) device is provided including providing at least one magnet positioned between a keeper device and a yoke, the keeper device being positioned at a pole region of the at least one magnet, positioning at least one pole device at the pole region of the at least one magnet, and removing the keeper device from the pole region to allow the at least one pole device to be positioned at the pole region of the at least one magnet.

9 Claims, 5 Drawing Sheets

METHOD OF MANUFACTURING A POLE FACE FOR A PERMANENT MAGNET MRI SYSTEM WITH LAMINATED STRUCTURE

CROSS REFERENCE TO RELATED APPLICATIONS

This application is a divisional of application Ser. No. 10/248,170 now U.S. Pat. No. 6,825,666, entitled "POLE FACE FOR PERMANENT MAGNET MRI WITH LAMINATED STRUCTURE", filed on Dec. 23, 2002.

BACKGROUND OF THE INVENTION

The present invention relates generally to magnetic resonance imaging (MRI) devices, and more particularly to MRI devices with a removable keeper plate.

MRI devices are widely used in the medical community as a diagnostic tool for imaging items such as tissue and bone structures. As described, for example, in U.S. Pat. No. 5,680,086 (which is incorporated by reference herein in its entirety), a conventional MRI device may include opposing pole pieces which define between them an imaging volume for the item to be imaged, the pole pieces having pole plates which are fabricated from wound high permeability soft magnetic material, and/or laminated members. One conventional MRI manufacturing technique is described in European Patent Application EP 0 978 727 A2 ("EP '727" hereafter), filed on Jul. 22, 1999, which is incorporated by reference herein in its entirety.

In conventional MRI device manufacturing techniques, a yoke is assembled between two ends of the MRI device, and two pole pieces are positioned thereon with a gap provided underneath the pole piece at each end for the MRI magnet. The MRI magnet is then formed by pushing individual pre-magnetized permanent magnet blocks in place under the pole pieces on each end of the MRI device. Once all of the pre-magnetized permanent magnet blocks are positioned and secured in place, the pole pieces are lowered to their ultimate position and secured in place.

An MRI device manufactured by the aforementioned manufacturing technique, however, suffers from inclusion of a backing plate used to reinforce the pole pieces during the manufacturing process. Specifically, in the course of pushing the pre-magnetized permanent magnet blocks into place, the pole pieces must endure large bending forces due to the moving pre-magnetized permanent magnet blocks. A backing plate is used to overcome the bending forces by stiffening the pole pieces. The backing plate, however, affects the magnetic field generated by the permanent magnet block array. In highly precise MRI devices, this can lead to a degradation in the detection properties of the MRI device.

Thus, a need exists for a method of manufacturing an MRI device free of a backing plate in a pole face of the pole piece, and/or a method of manufacturing an MRI device with the pole pieces being subjected to a weaker and/or channeled magnetic fields during assembly.

BRIEF SUMMARY OF THE INVENTION

The present invention is directed at reducing or eliminating one or more of the problems set forth above, and other problems found within the prior art.

According to one aspect of the present invention, a method of manufacturing a magnetic resonance imaging (MRI) device is provided comprising the steps of providing at least one magnet positioned between a keeper device and a yoke, the keeper device being positioned at a pole region of the at least one magnet, positioning at least one pole device at the pole region of the at least one magnet, and removing the keeper device from the pole region to allow the at least one pole device to be positioned at the pole region of the at least one magnet.

According to another aspect of the present invention, a magnetic resonance imaging (MRI) device including a yoke and at least one magnet aligned with the yoke is provided, the at least one magnet generating a magnetic field within the MRI device, the MRI device comprising at least one pole device for shaping the magnetic field generated by the at least one magnet, the at least one pole device being positioned at a pole region of the at least one magnet and being free of a solid metal backing plate in a pole face of the at least one pole device.

According to another aspect of the present invention, a magnetic resonance imaging (MRI) device is provided comprising means for generating a magnetic field, means for shaping the magnetic field, and means for positioning the means for generating a magnetic field at a pole region of the means for shaping the magnetic field.

According to another aspect of the present invention, a method of reconfiguring a magnetic resonance imaging (MRI) device is provided comprising the steps of positioning a keeper device at a pole region of at least one magnet, moving the at least one magnet from an initial position to a reconfigured position, and removing the keeper device from the pole region of the at least one magnet to allow at least one pole device to be positioned at the pole region of the at least one magnet.

DETAILED DESCRIPTION OF THE INVENTION

Reference will now be made in detail to presently preferred embodiments of the present invention. Wherever possible, the same reference numbers will be used throughout the drawings to refer to the same or like parts.

Figure 1:
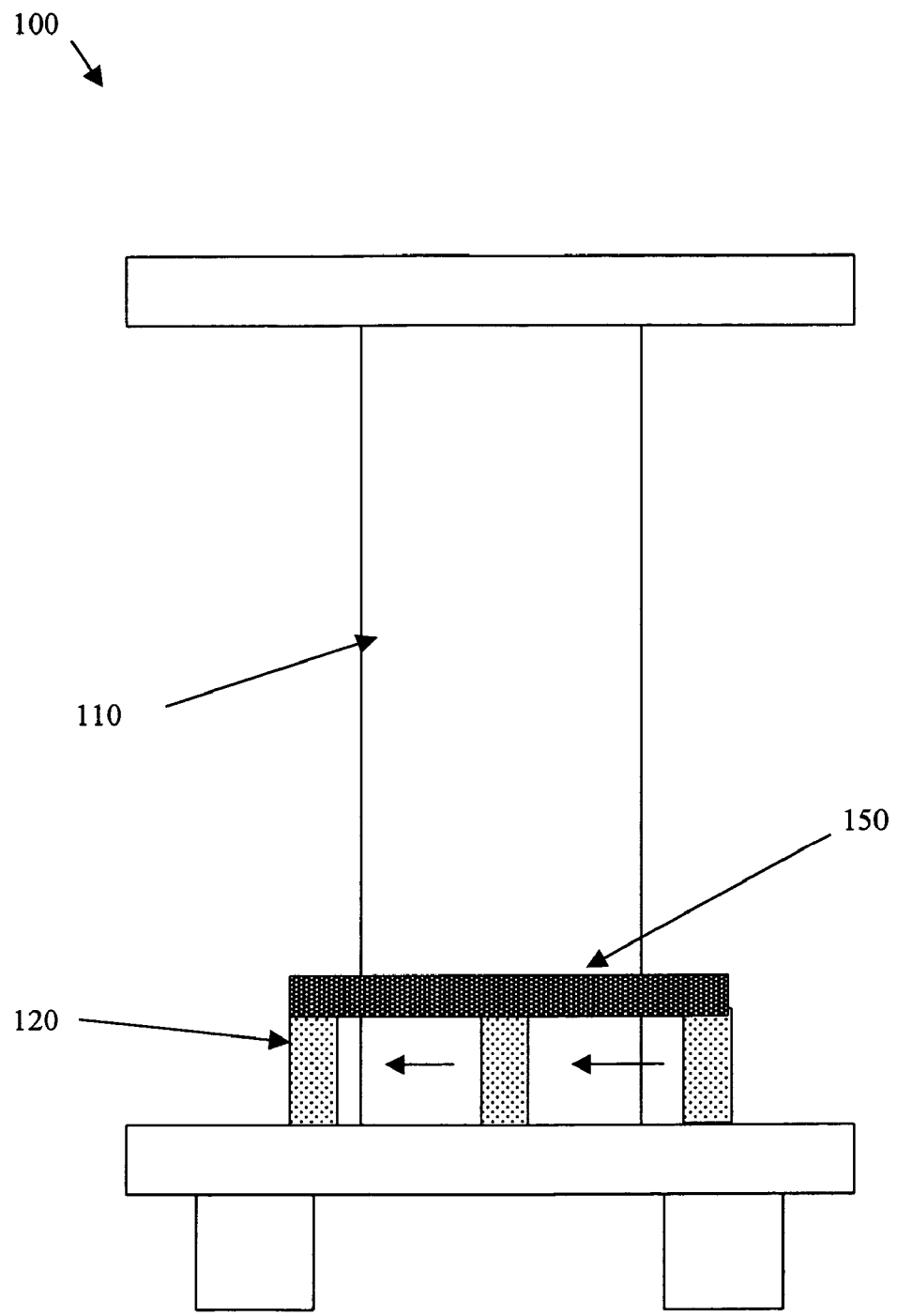
FIG. 1 is a block diagram of a MRI device undergoing an assembly step according to a preferred embodiment of the present invention.

A MRI device 100 undergoing assembly at one end thereof according to a first embodiment of the present invention is shown in the block diagram of FIG. 1. For purposes of illustration only, the following description and the accompanying Figures only describe the manufacture of one end of the MRI device 100. It should be appreciated, however, that the opposite end of the MRI device 100 can be manufactured from the same (or similar) technique, simultaneously with, before, or after the end depicted is assembled.

The MRI device 100 includes an iron yoke 110 and a keeper plate 150. Preferably, the iron yoke 110 is first assembled on the MRI device 100, and then the keeper plate 150 is temporarily positioned thereon. Once the keeper plate 150 is secured in place, a plurality of permanent magnet blocks 120 are slid into place beneath the keeper plate 150 (collectively the assembled "MRI magnet" 125 in FIG. 2) as indicated by the arrows pointing from right to left. The assembled MRI magnet 125 can be made of any one of a number of conventional magnetic materials, and formed in a conventional manufacturing process as is well known in the art (see, for example, U.S. Pat. No. 4,770,723, which is incorporated herein by reference in its entirety). The assembled MRI magnet 125 is arranged on (or near) iron yoke 110 in such a way as to generate a magnetic field within the MRI device 100 for imaging an item. One exemplary arrangement is described in U.S. application Ser. No. 09/824,245 filed on Apr. 3, 2001, which is incorporated by reference herein in its entirety.

Figure 2:
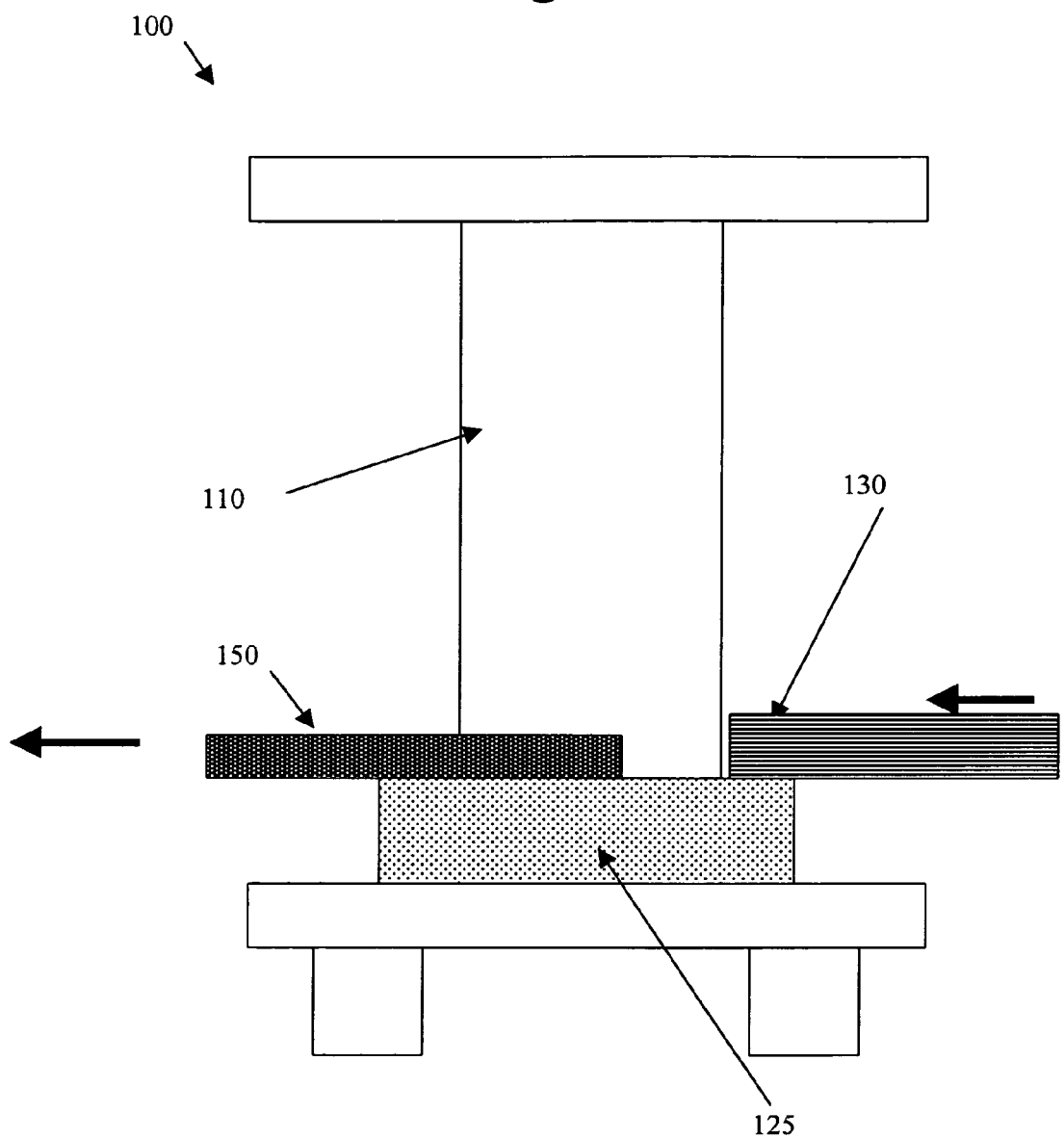
FIG. 2 is a block diagram of the MRI device of FIG. 1 undergoing a different assembly step according to a preferred embodiment of the present invention.

As shown in FIG. 2, once the MRI magnet 125 is assembled, the keeper plate 150 is "swapped" with pole face laminate 130. The keeper plate 150 is adapted to channel at least a portion of the magnetic field generated by the assembled MRI magnet 125 while the pole face laminate 130 is positioned. In FIGS. 1 and 2, the keeper plate 150 is shown positioned at the pole regions near the sides of the assembled MRI magnet 125. Hence, the pole face laminate 130 is subjected to a weaker magnetic field, which makes it easier to properly align and position the pole face laminate 130, and also eliminates the need for a solid metal backing plate used to position and protect (e.g., via sliding) the pole face laminate 130 during assembly. Thus, in the present invention, the pole face laminate 130 can be used without a backing plate. Alternatively and less preferably, a solid metal backing plate may be used in conjunction with the keeper plate 150.

It should be appreciated that the pole face laminate 130 is positioned in such a way as to shape and focus the magnetic field generated by the assembled MRI magnet 125 in the item to be imaged (e.g., by drawing magnetic flux generated by the assembled MRI magnet 125). Preferably, the pole face laminate 130 is thus positioned between the assembled MRI magnet 125 and the "hypothetical" item to be imaged. The pole face laminate 130 can be made as described, for example, in U.S. application Ser. No. 09/198,507 filed on Nov. 24, 1998 which is incorporated by reference herein in its entirety.

Figure 3:
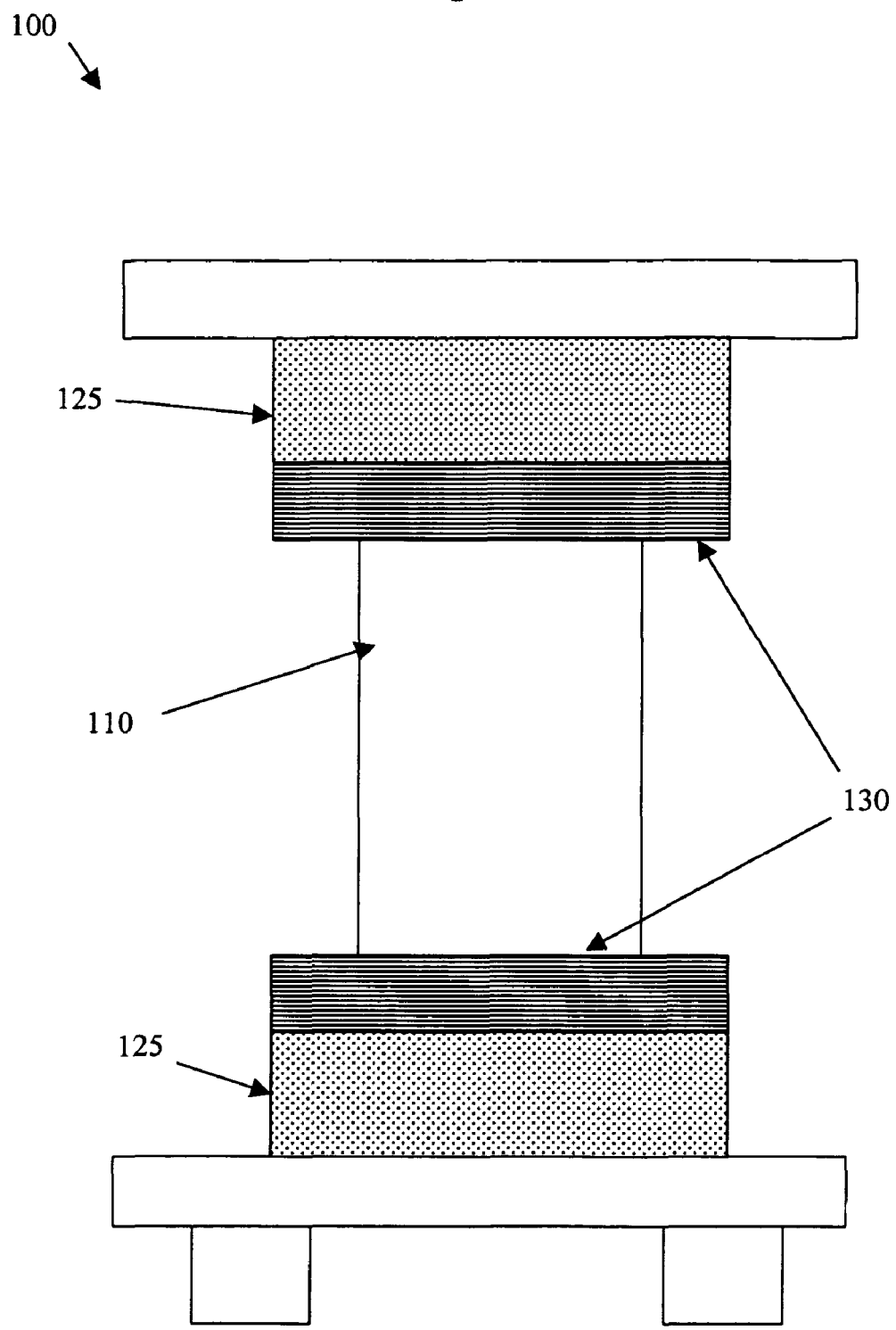
FIG. 3 is a block diagram of an assembled MRI device according to a preferred embodiment of the present invention.

As noted above, the keeper plate 150 is preferably removable, such that the keeper plate 150 can be gradually removed during simultaneous positioning of the pole face laminate 130. Swapping the keeper plate 150 with the pole face laminate 130 provides for easier removal of the keeper plate 150 and placement of the pole face laminate 130, as the pole face laminate 130 and the keeper plate 150 are only partially subjected to the magnetic field generated by the assembled MRI magnet 125 by sharing the magnetic flux load with the other. An MRI device 100 manufactured by the aforementioned process is shown in the block diagram of FIG. 3. As shown, the MRI device 100 includes yoke 110, two pole face laminates 130, and two assembled MRI magnets 125. The MRI device 100 is free, however, from a backing plate attached to each of the pole face laminates 130. By eliminating the backing plate, the cost and complexity of the MRI device 100 and machinery necessary to assemble it can be reduced. Furthermore, elimination of the backing plate eliminates any magnetic interference previously caused by the backing plate, resulting in a more uniform (and predictable) magnetic field for imaging the item to be imaged.

Figure 4:
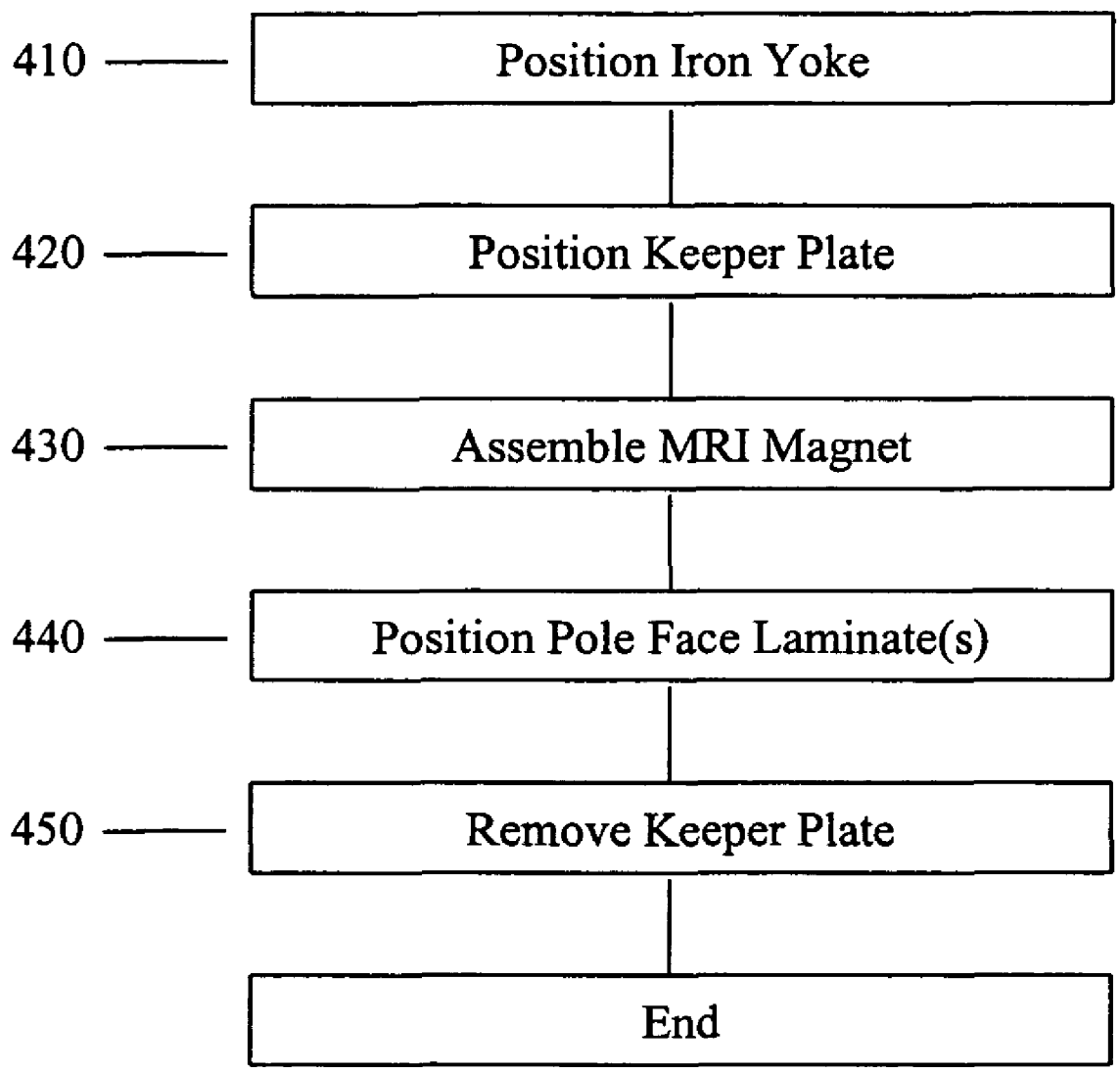
FIG. 4 is a flow chart of a method of manufacturing a MRI device according to a preferred embodiment of the present invention.

A method of manufacturing an MRI device 100 according to an embodiment of the present invention will now be described in reference to the flowchart of FIG. 4. It should be appreciated that the order of the method steps may vary and/or be combined, as would be readily apparent to one of ordinary skill in the art after reading this disclosure. Furthermore, additional method steps may be provided as needed, such as cleaning steps, gluing steps, etc. In other words, the following description is not an exhaustive list of every method step or order thereof within the scope of the present invention.

In step 410, an iron yoke is positioned in an MRI device. A magnetic keeper plate is then positioned substantially above the iron yoke in step 420, providing a gap between the magnetic keeper plate and the iron yoke for a MRI magnet. A plurality of permanent magnet blocks (collectively the assembled "MRI magnet") are then arranged in the gap between the magnetic keeper plate and the iron yoke in step 430 in such a way as to generate a magnetic field in an item to be imaged. The permanent magnet blocks may be formed in a conventional manner as previously described. Preferably, the magnetic keeper plate is positioned in step 420 prior to assembling the MRI magnet on the iron yoke in step 430 in order to channel the magnetic field generated by the MRI magnet as it is being assembled.

After the MRI magnet is assembled on the iron yoke in step 430, the keeper plate will be positioned at the pole region of the magnet. The pole face laminates are then positioned in step 440. Preferably, the pole face laminates are positioned in step 440 simultaneously while removing the keeper plate in step 450 (e.g., by sliding the keeper plate out of the device), thereby "swapping" the pole face laminates for the keeper plate. This allows the pole face laminates to be easily positioned due to the magnetic field being partially channeled by the keeper plate as it is removed. Once the pole face laminates are positioned at the pole regions in step 440, the keeper plate is then completely removed from the device in step 450, and can be used to assemble another MRI device (if desired).

Figure 5:
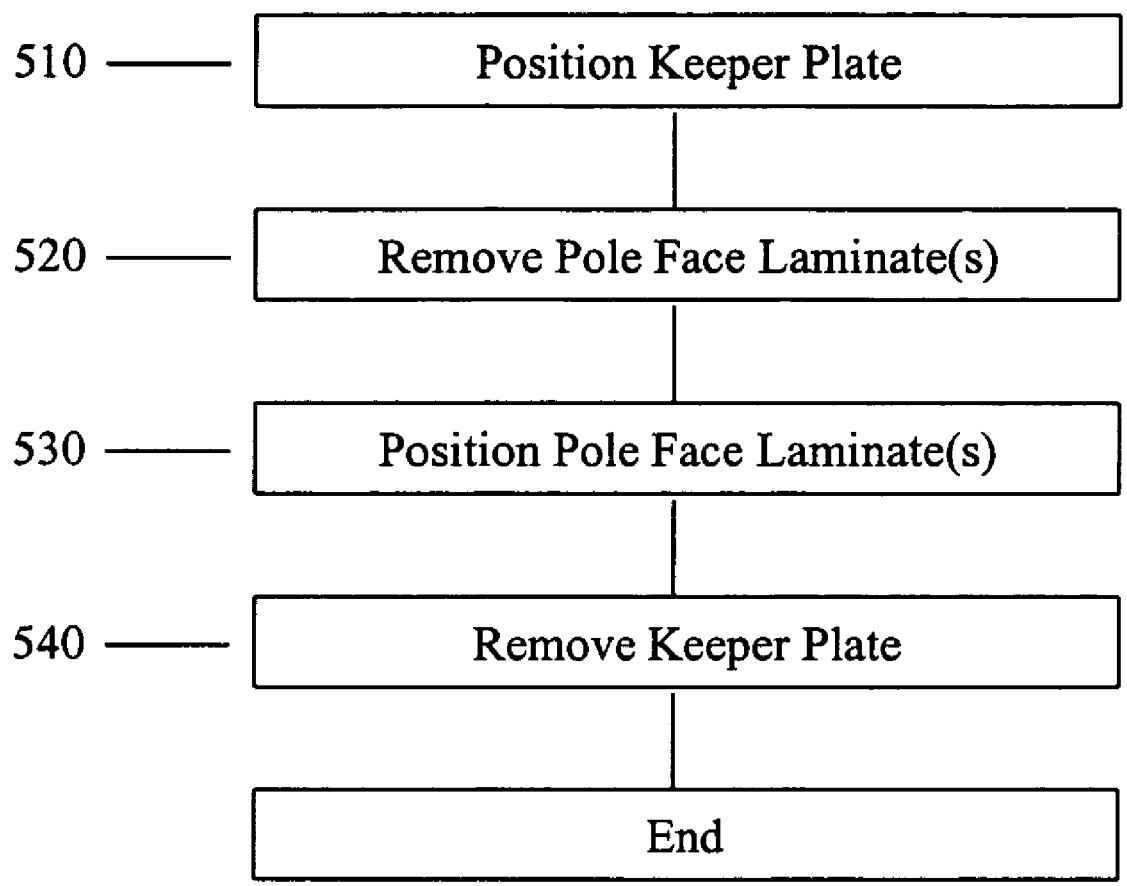
FIG. 5 is a flow chart of a method of reconfiguring a MRI device according to a preferred embodiment of the present invention.

One advantage of the aforementioned removable keeper plate is the ability to reconfigure an MRI device previously assembled using the aforementioned manufacturing process (see FIG. 5). To reconfigure the MRI device, the keeper plate is moved back into a pole region position in step 510. Preferably, the keeper plate is moved back into position in step 510 while simultaneously removing the pole face laminates in step 520. The pole face laminates can then be exchanged for new or reconfigured pole face laminates, the MRI magnet can be adjusted (e.g., by adding, removing, or relocating permanent magnet blocks), etc. and then repositioned in step 530. The keeper plate is then removed in step 540, preferably while simultaneously performing step 530. Hence, the present invention provides for reconfigurable MRI devices, which could not be easily performed with conventional MRI devices.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a magnetic resonance imaging (MRI) device, comprising the steps of:

positioning at least one magnet between a magnetic keeper plate and a yoke, the magnetic keeper plate being positioned at a pole region of the at least one magnet; and swapping said magnetic keeper plate with at least one pole device so as to position said at least one pole device at the pole region of said at least one magnet.

2. The method of claim 1, wherein at least a portion of a magnetic field generated by said at least one magnet is channeled through said magnetic keeper plate while positioning said at least one pole device.

3. The method of claim 1, wherein said providing step comprises:

aligning said magnetic keeper plate with said yoke; and
positioning said at least one magnet in a gap between said magnetic keeper plate and said yoke.

4. The method of claim 1, wherein said swapping step comprises:

sliding said magnetic keeper plate out of the pole region of said at least one magnet,
wherein at least a portion of a magnetic field generated by said at least one magnet is channeled through said at least one pole device while sliding said magnetic keeper plate out of the pole region of said at least one magnet.

5. The method of claim 1, wherein said at least one pole device comprises:

at least one laminated pole plate.

6. The method of claim 1, wherein said at least one pole device comprises:

a plurality of pole plates positioned adjacent to said magnetic keeper plate ice in said positioning step.

7. The method of claim 1, wherein said magnetic keeper plate comprises:

at least one solid pole plate.

8. The method of claim 1, wherein the at least one magnet comprises a permanent magnet.

9. The method of claim 1, wherein said swapping step comprises gradually removing said magnetic keeper plate from the pole region of said at least one magnet while simultaneously positioning said at least one pole device at the pole region of said at least one magnet.

\* \* \* \* \*